United States Patent
Ghiladi et al.

(10) Patent No.: US 11,884,784 B2
(45) Date of Patent: *Jan. 30, 2024

(54) PHOTODYNAMIC COMPOSITIONS, METHODS OF MAKING, AND USES THEREOF

(71) Applicant: North Carolina State University, Raleigh, NC (US)

(72) Inventors: Reza Arman Ghiladi, Raleigh, NC (US); Dimitris Argyropoulos, Raleigh, NC (US); Frank Scholle, Raleigh, NC (US)

(73) Assignee: North Carolina State University, Raleigh, NC (US)

( * ) Notice: Subject to any disclaimer, the term of this patent is extended or adjusted under 35 U.S.C. 154(b) by 131 days.

This patent is subject to a terminal disclaimer.

(21) Appl. No.: 17/320,524

(22) Filed: May 14, 2021

(65) Prior Publication Data

US 2021/0269604 A1 Sep. 2, 2021

Related U.S. Application Data

(63) Continuation-in-part of application No. 16/099,995, filed as application No. PCT/US2017/031932 on May 10, 2017, now Pat. No. 11,039,616.

(60) Provisional application No. 62/334,150, filed on May 10, 2016.

(51) Int. Cl.

| C08J 3/21 | (2006.01) |
| C09D 11/328 | (2014.01) |
| G03F 7/004 | (2006.01) |
| G03F 7/20 | (2006.01) |
| C08K 3/22 | (2006.01) |
| C08K 5/56 | (2006.01) |
| C09D 11/38 | (2014.01) |

(52) U.S. Cl.
CPC .............. C08J 3/212 (2013.01); C08K 3/22 (2013.01); C08K 5/56 (2013.01); C09D 11/328 (2013.01); C09D 11/38 (2013.01); G03F 7/004 (2013.01); G03F 7/2022 (2013.01); C08J 2301/02 (2013.01); C08K 2003/2227 (2013.01)

(58) Field of Classification Search
None
See application file for complete search history.

(56) References Cited

U.S. PATENT DOCUMENTS

| 2005/0220744 A1* | 10/2005 | Kamachi | A61K 8/676 424/70.1 |
| 2010/0129432 A1* | 5/2010 | Chen | A61K 31/365 424/450 |
| 2015/0086631 A1* | 3/2015 | Kishen | A61K 41/0057 514/777 |

FOREIGN PATENT DOCUMENTS

| RU | 2136395 C1 | 9/1999 | |
| RU | 2526803 C2 | 8/2014 | |
| WO | WO-9300815 A1 * | 1/1993 | ............. A01N 25/10 |
| WO | 2007075119 A1 | 5/2007 | |
| WO | WO-2009077908 A1 * | 6/2009 | ......... A61K 41/0071 |

OTHER PUBLICATIONS

Yoneda et al. (WO2008068843A1 Machine English Translation) (Year: 2008).*
CN104264486A Machine English Translation (Year: 2015).*
International Search Report dated Aug. 24, 2017.
"Photobactericidal Porphyrin-Cellulose Nanocrystals: Synthesis, Characterization, and Antimicrobial Properties" by Feese et al., Biomacromolecules No. 12, pp. 3528-3539, Aug. 2011.
"Porphyrin-Cellulose Nanocrystals: A Photobactericidal Material that Exhibits Broad Spectrum Antimicrobial Activity" by Carpenter et al., Photochemistry and Photobiology, 88: 527-536, Feb. 2012.
"Antiviral, Antifungal and Antibacterial Activities of a BODIPY-Based Photosensitizer" by Carpenter et al., Molecules No. 20, pp. 10604-10621, Jun. 2015.
"Synthesis, Characterization, and Antimicrobial Efficacy of Photomicrobicidal Cellulose Paper" by Carpenter et al., Biomacromolecules, No. 16, pp. 2482-2492, Jul. 2015.
"Photosensitizer—Embedded Polyacrylonitrile Nanofibers as Antimicrobial Non-Woven Textile" by Stanley et al., Nanomaterials No. 6, 77, Apr. 2016.

* cited by examiner

*Primary Examiner* — Robert A Wax
*Assistant Examiner* — Quanglong N Truong
(74) *Attorney, Agent, or Firm* — THOMAS | HORSTEMEYER, LLP

(57) ABSTRACT

Provided herein are photodynamic compositions that can contain a natural polymer scaffold and a photosensitizer, where the photosensitizer can be covalently or non-covalently attached to the natural polymer scaffold. Also provided herein are structures and objects that can contain the photodynamic compositions. Further provided herein are methods of making and using the photodynamic compositions. Finally provided herein are printing ink formulations.

26 Claims, 8 Drawing Sheets

0.05 wt% Methylene Blue

0.05 wt% BODIPY

PHOTODYNAMIC COMPOSITIONS, METHODS OF MAKING, AND USES THEREOF

CROSS-REFERENCE TO RELATED APPLICATIONS

This application is a continuation-in-part of U.S. Utility application Ser. No. 16/099,995, filed on Nov. 8, 2018, which is the 35 U.S.C. § 371 national stage application of PCT application No. PCT/US2017/031932, which claims the benefit of and priority to U.S. provisional application No. 62/334,150, filed on May 10, 2016, entitled "PHOTODYNAMIC COMPOSITIONS, METHODS OF MAKING, AND USES THEREOF," the contents of all of which are incorporated by reference herein in their entireties.

BACKGROUND

The survival of bacteria, fungi, and viruses on surfaces leads to the subsequent transmission of these pathogens to new hosts, and significantly contributes to their proliferation, which in turn considerably increases their threat to human health, especially by antibiotic resistant strains. As such there exists an urgent need for antibacterial compositions and methods of use.

SUMMARY

In some aspects, provided herein are photodynamic compositions that can contain a natural polymer scaffold; and a photosensitizer, wherein the photosensitizer can be attached to the natural polymer scaffold. The photosensitizer can be attached to the natural polymer scaffold by a covalent bond. The photosensitizer can be attached to the natural polymer scaffold by a non-covalent bond. The non-covalent bond can be an electrostatic interaction. The photosensitizer can be a positively charged photosensitizer. The positively charged photosensitizer can be selected from the group of: positively charged porphyrins, positively charged phthalocyanines, positively charged BODIPY based compounds, positively charged chlorins, positively charged bacteriochlorins, positively charged anthocyanins, positively charged rose bengal, positively charged phenothiazine derivatives, and any permissible combinations thereof. The photosensitizer can be a negatively charged photosensitizer. The negatively charged photosensitizer can be selected from the group of: negatively charged porphyrins (e.g., 5,10,15,20-tetrakis(4-sulphonatophenyl)porphyrin, 5,10,15,20-tetrakis(4-carboxyphenyl)porphyrin-Pd(II)), negatively charged phthalocyanines (phthalocyanine tetrasulphonic acid), negatively charged BODIPY based compounds, negatively charged chlorins, negatively charged bacteriochlorins, negatively charged anthocyanins, negatively charged rose bengal, negatively charged methylene blue and related phenothiazine derivatives, and any permissible combinations thereof. The natural polymer scaffold can be selected from the group consisting of: nanofibrillated cellulose, nanocrystalline cellulose, cellulose fibers, starch, lignin, chitosan, nanofibrillated chitosan, poly-glucosamine, and any permissible combinations thereof. In an embodiment, the natural polymer scaffold can be nanocrystalline cellulose, cellulose fibers, lignin, chitin, chitosan, nanofibrillated chitosan, poly-glucosamine, polylactic acid, wool, silk, cotton, and any permissible combinations thereof. The natural polymer scaffold can be negatively functionalized. The natural polymer scaffold can be positively functionalized. In some aspects, any of the compositions provided herein can further contain a synthetic polymer. The synthetic polymer can be polyacrylonitrile. In some aspects, any of the compositions provided herein can further contain a second photosensitizer, wherein the second photosensitizer can be attached to the synthetic polymer by a covalent or non-covalent interaction. In some aspects, any of the compositions provided here can form a coating when applied to the surface of a material. In some aspects, the photodynamic compositions provided herein can be antimicrobial.

In other aspects, provided herein are objects and/or structures that can include any composition as provided herein. In some aspects, the compositions as provided herein can form a coating on a surface of the object or the structure. In some aspects, the compositions as provided herein can be assimilated into the object or the structure. In some aspects, the object or the structure can be a textile. In some aspects, the object or the structure can be a container or packaging material. In some aspects the object or the structure can be a wall, celling, or floor.

In other aspects provided herein are methods of making the compositions provided herein. The methods can contain the step of mixing a natural polymer scaffold and a photosensitizer, wherein the step of mixing can form a non-covalent or a covalent interaction between the natural polymer scaffold and the photosensitizer.

In certain aspects, described herein is a composition comprising: a natural polymer scaffold, wherein the natural polymer scaffold is selected from the group consisting of: nanocrystalline cellulose, cellulose fibers, lignin, chitin, chitosan, nanofibrillated chitosan, poly-glucosamine, polylactic acid, wool, silk, cotton, and any permissible combinations thereof; and a photosensitizer, wherein the photosensitizer is attached to the natural polymer scaffold.

In embodiments of compositions according to the present disclosure, the photosensitizer can be attached to the natural polymer scaffold by a covalent bond or a non-covalent bond. In embodiments of compositions according to the present disclosure, the non-covalent bond is an electrostatic interaction, hydrogen-bonding interaction, or a hydrophobic interaction. In embodiments of compositions according to the present disclosure, the photosensitizer is a positively charged photosensitizer, a negatively charged photosensitizer, or a neutral photosensitizer. In embodiments of compositions according to the present disclosure, the natural polymer scaffold is negatively functionalized or positively functionalized. In embodiments of compositions according to the present disclosure, compositions further comprise a synthetic polymer. In embodiments of compositions according to the present disclosure, compositions further comprise a second photosensitizer, wherein the second photosensitizer is attached to the synthetic polymer by a covalent or non-covalent interaction.

In additional aspects, described herein are inkjet printing compositions (also referred to herein as printing ink, inkjet ink, inkjet printing ink, or two-dimensional printing ink (i.e. 2D printing ink). In certain aspects, described herein are inkjet printing compositions comprising a composition as described herein, a metal oxide, and a dye.

In embodiments of inkjet printing inks according to the present disclosure, the metal oxide is a cationic metal oxide In embodiments of inkjet printing inks according to the present disclosure, the metal oxide is an alumina oligomer. In embodiments of inkjet printing inks according to the present disclosure, the dye comprises one or more of a anthraquinone, catechol, hydroxyazo or salicylic acid groups. In embodiments of inkjet printing inks according to the present disclosure, the dye is one or more of Carminic Acid, Alizarin Red, Acid Blue 45, Acid Green 41, Hematoxylin, Chromoxane Cyanine R, Calconcarboxylic Acid, Plasmocorinth B, Pyrocatechol, Acid Alizarin Violet N, Mordant Yellow 12, or Mordant Blue 9. In embodiments of inkjet printing inks according to the present disclosure, inkjet printing inks further comprise an inkjet additive.

In embodiments of inkjet printing inks according to the present disclosure, the inkjet additive is one or more of a polyol, viscosity modifier, non-ionic surfactant, drying preventing agent, penetration accelerator, ultraviolet light absorber, antioxidant, antifungal agent, pH adjuster, antifoaming agent, dispersion aid, dispersion stabilizer, antirusting agent, or chelating agent.

BRIEF DESCRIPTION OF THE DRAWINGS

Further aspects of the present disclosure will be readily appreciated upon review of the detailed description of its various embodiments, described below, when taken in conjunction with the accompanying drawings.

(FIG. 7A) Gram-positive species: methicillin-resistant *S. aureus* (MRSA) ATCC-44. (FIG. 7B) Gram-negative species: multidrug-resistant *A. baumannii* (MDRAB) ATCC-1605. For both panels, displayed are the illuminated (dark grey) conditions as the percent survival of the dark control (black) for 0.1 wt % TMPyP in NFC-NeoCryl 80/20 and 0.1 wt % MB in NFC-NeoCryl 80/20. For both bacteria, the illumination conditions were as follows: 30 min, 400-700 nm, 65±5 mW/cm$^2$ (total fluence of 118 J/cm$^2$).

DETAILED DESCRIPTION

Figure 1A:
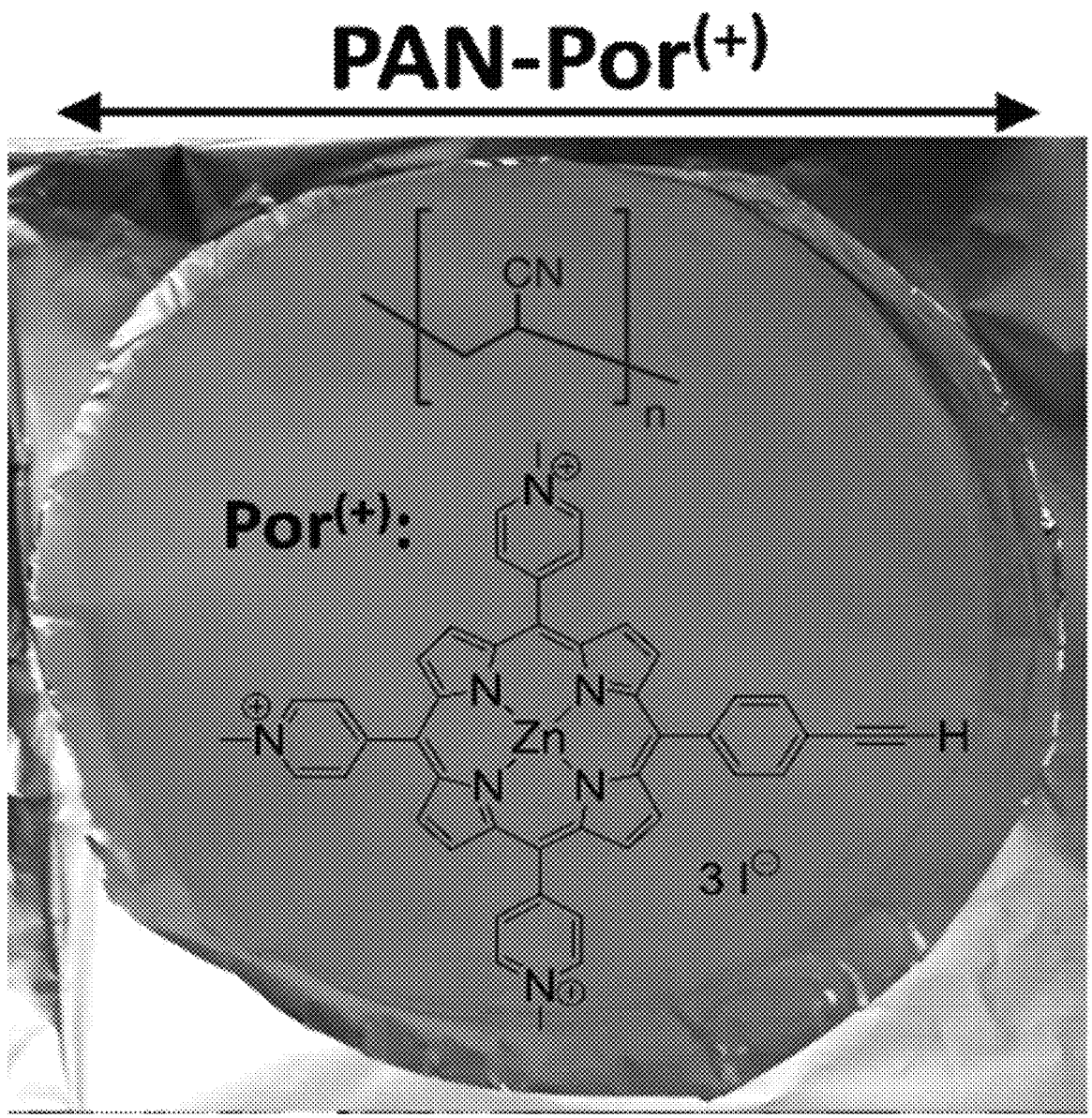
FIGS. 1A-1B shows representative photograph (FIG. 1A) and micrographic images (FIG. 1B) of one embodiment of a polyacrylonitrile-based photodynamic composition.

Before the present disclosure is described in greater detail, it is to be understood that this disclosure is not limited to particular embodiments described, and as such may, of course, vary. It is also to be understood that the terminology used herein is for the purpose of describing particular embodiments only, and is not intended to be limiting.

Where a range of values is provided, it is understood that each intervening value, to the tenth of the unit of the lower limit unless the context clearly dictates otherwise, between the upper and lower limit of that range and any other stated or intervening value in that stated range, is encompassed within the disclosure. The upper and lower limits of these smaller ranges may independently be included in the smaller ranges and are also encompassed within the disclosure, subject to any specifically excluded limit in the stated range. Where the stated range includes one or both of the limits, ranges excluding either or both of those included limits are also included in the disclosure.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, the preferred methods and materials are now described.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present disclosure is not entitled to antedate such publication by virtue of prior disclosure. Further, the dates of publication provided could be different from the actual publication dates that may need to be independently confirmed.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure. Any recited method can be carried out in the order of events recited or in any other order that is logically possible.

Embodiments of the present disclosure will employ, unless otherwise indicated, techniques of molecular biology, microbiology, nanotechnology, organic chemistry, biochemistry, botany and the like, which are within the skill of the art. Such techniques are explained fully in the literature.

Definitions

As used herein, "copolymer" can be used to refer to a polymer chain having two or more different types of monomers with in that chain. "Copolymer" can include block copolymers (such as di-block and tri-block copolymers), statistical (random) copolymers, gradient copolymers, and the like.

As used herein, "homopolymer" can be used to refer to a polymer chain having only one type of monomer.

As used herein, "polymer" can refer to any type of polymer, including but not limited to homopolymers, copolymers, linear polymers, and branched polymers.

As used herein, "photosensitizer" can refer to molecule, compounds, and compositions that can produce a chemical, biochemical, and/or physical change in response to being stimulated with light. The light can be any wavelength of light including, but not limited to, all visible light, all UV light, infrared light, and fluorescent light.

As used herein, "photodynamic" refers to the ability of a compositions to respond chemically, physically, biochemically, or otherwise change in response to being contacted or otherwise stimulated by a light. The light can be any wavelength of light including, but not limited to, all visible light, all UV light, infrared light, and fluorescent light.

As used herein, "antimicrobial" can refer to the ability of a composition to kill, eliminate, a microbe or population thereof. "Antimicrobial" can also refer to the ability of a composition to prevent the growth of a microbe or population thereof. "Antimicrobial" therefore can encompass the terms antibacterial, antiviral, antifungal, antiparasitic, bacteriostatic, and the like.

As used herein, the term "microbe" can refer to any living organism that is too small to be observed by the naked human eye. As such, "microbe" includes but is not limited to bacteria, protists, some fungi, and viruses.

The term "molecular weight", as used herein, generally refers to the mass or average mass of a material. If a polymer or oligomer, the molecular weight can refer to the relative average chain length or relative chain mass of the bulk polymer. In practice, the molecular weight of polymers and oligomers can be estimated or characterized in various ways including gel permeation chromatography (GPC) or capillary viscometry. GPC molecular weights are reported as the weight-average molecular weight (Mw) as opposed to the number-average molecular weight ($M_n$). Capillary viscometry provides estimates of molecular weight as the inherent viscosity determined from a dilute polymer solution using a particular set of concentration, temperature, and solvent conditions.

As used herein "biodegradable" generally refers to a material that will degrade or erode under physiologic conditions to smaller units or chemical species that are capable of being metabolized, eliminated, or excreted by the subject. The degradation time is a function of composition and morphology. Degradation times can be from hours to weeks.

The term "hydrophilic", as used herein, refers to substances that have strongly polar groups that readily interact with water.

The term "hydrophobic", as used herein, refers to substances that lack an affinity for water; tending to repel and not absorb water as well as not dissolve in or mix with water.

The term "lipophilic", as used herein, refers to compounds having an affinity for lipids.

The term "amphiphilic", as used herein, refers to a molecule combining hydrophilic and lipophilic (hydrophobic) properties.

As used herein, "about," "approximately," and the like, when used in connection with a numerical variable, generally refers to the value of the variable and to all values of the variable that are within the experimental error (e.g., within the 95% confidence interval for the mean) or within +/−10% of the indicated value, whichever is greater.

As used herein, "control" is an alternative subject or sample used in an experiment for comparison purpose and included to minimize or distinguish the effect of variables other than an independent variable.

As used herein, "positive control" refers to a "control" that is designed to produce the desired result, provided that all reagents are functioning properly and that the experiment is properly conducted.

As used herein, "negative control" refers to a "control" that is designed to produce no effect or result, provided that all reagents are functioning properly and that the experiment is properly conducted. Other terms that are interchangeable with "negative control" include "sham," "placebo," and "mock."

Discussion

According to the CDC's Healthcare-Associated Infections (HAI) Prevalence Survey, there were an estimated 722,000 HAIs in U.S. acute care hospitals in 2011, equivalent to about 1 out of every 25 inpatients having at least one health care-associated infection on any given day. Approximately 75,000 deaths were attributed to these infections, or about 10% of the total HAIs. When one considers that these estimates of the national burden of health care-associated infections were limited to acute care hospitals, factoring in the magnitude of HAIs attributed to other settings (e.g., skilled nursing facilities, outpatient clinics, urgent care facilities) further highlights the scope and staggering cost of nosocomial infections. One of the main contributing factors to HAIs is the ability of pathogens such as bacteria, fungi, and viruses to adhere to, and survive on, surfaces that leads to their subsequent transmission to new hosts. As an example, *Staphylococcus aureus* can survive for weeks to months under dry conditions on the cotton and polyester fabrics used in hospitals. Though typically not a concern for healthy individuals, a second factor that contributes to HAIs is drug resistance, and five classes of antibiotic-resistant pathogens in particular have emerged as major public health threats: vancomycin-resistant enterococci (VRE), methicillin-resistant *Staphylococcus aureus* (MRSA), multidrug-resistant mycobacteria, Gram-negative bacteria, and fungi. To combat these contributing factors to HAIs, more research into effective surface disinfection and alternative materials (fabrics, plastics or coatings) with antimicrobial properties capable of overcoming drug-resistance is needed. Moreover, food processing, packaging and service industries, waste water treatment, daycare facilities, and personal households are other areas where infectious agents are easily spread, but may be countered by an anti-infective coating.

Several classes of antimicrobial agents are currently being investigated or are commercially available, yet have disadvantages such as the loss of antimicrobial activity by leaching of the biocide, consumption of the germicidal ability, environmentally hazardous agents, dependency on direct contact of the antimicrobial entity with the microorganism, and/or their efficacy is often limited to a single class of microbe (i.e., only bacteria or fungi).

A promising area that circumvents many of these disadvantages while at the same time satisfies many of the aforementioned criteria of an ideal anti-infective material is antimicrobial photodynamic inactivation (aPDI). This branch of photomedicine employs light, air, and a photosensitizer (PS) to generate primarily singlet oxygen ($^1O_2$) as the biocidal agent, and represents a complementary strategy for the treatment of microbial infections. Advantages of materials-based aPDI include i) employing singlet oxygen as the biocidal agent (which, given its short lifetime and decay to harmless oxygen as an end product, can be considered environmentally benign), ii) multiple routes to PS incorporation, including the attachment of the PS through electrostatic interactions, encapsulation within a polymeric matrix, or direct attachment via a covalent bond (prevents leaching into the environment), iii) the ability of the PS to potentially function in the absence of direct contact with the pathogen due to the diffusibility of singlet oxygen, and iv) of great importance with respect to nosocomial infections is that singlet oxygen or other photo-generated reactive oxygen species cause non-specific damage from which microbial resistance is unlikely to arise. To this latter point, aPDI has been shown to possess broad-spectrum antibacterial, antiviral, antifungal, and antiparasitic properties. Finally, as aPDI employs harmless white light, it has the advantage over Ultra Violet-C light irradiation (as an example of another light-based sterilization technique), vaporized hydrogen peroxide, or chlorine dioxide in that it can function without the need for protecting people against the deleterious effects of the biocidal agent.

A number of materials based upon a photodynamic mode of action have been recently reported. These include: synthetic polymer materials (polyurethane, polystyrene, polycaprolactone and polyamide-6) with encapsulated photosensitizers [e.g., free-base or zinc tetraphenylporphyrin, zinc phthalocyanine, cationic 5,10,15,20-tetrakis(1-methylpyridinium-4-yl)porphyrin (TMPyP)] that exhibit photobactericidal (*E. coli*) and photovirucidal (against non-enveloped polyomavirus and enveloped baculovirus) efficacy, as well as natural polymer materials based on cellulose nanocrystals (Por$^{(+)}$-CNCs), cellulose fibers (Por$^{(+)}$-paper), or cotton fabrics that possess broad anti-infective efficacy against both bacteria (e.g., *Staphylococcus aureus*, vancomycin-resistant *Enterococcus faecium*, *Acinetobacter baumannii*, *Pseudomonas aeruginosa*, and *Klebsiella pneumonia*) and viruses (e.g., dengue-1, influenza A, and human adenovirus-5).

However, these materials are not without limitations. First, most are synthetic materials. Synthetic polymer materials have an advantage in that their nanofibers are able to encapsulate photosensitizers, obviating the need for a covalent synthetic strategy, but their use is hindered by the fact that such non-natural scaffolds are not inherently biodegradable or biocompatible. Further, those that are not synthetic (e.g. cellulose fibers and cellulose nanocrystals) are not able to encapsulate photosensitizers, necessitating the need for tedious covalent attachment/grafting of the photosensitizers onto the cellulose polymer, thus limiting their scale-up potential and their practical utility.

With that said, described herein are describe are photodynamic compositions that can be antimicrobial and methods of using the photodynamic compositions. The photodynamic compositions can include a natural polymer scaffold and an attached photosensitizer. The photodynamic compositions provided herein can have broad-spectrum antibacterial, antiviral, antifungal, and/or antiparasitic properties. The photodynamic compositions provided herein can also have the advantage in that can utilize white light. As such, they can function without the need for protecting people and/or animals from a deleterious effect of the biocidal agent. The compositions provided herein can be used as coatings that can be applied to a material, incorporated into materials and/or textiles that can have further use in various industries.

Other compositions, compounds, methods, features, and advantages of the present disclosure will be or become apparent to one having ordinary skill in the art upon examination of the following drawings, detailed description, and examples. It is intended that all such additional compositions, compounds, methods, features, and advantages be included within this description, and be within the scope of the present disclosure.

Photodynamic Compositions

A number of materials based upon a photodynamic mode of action have been recently reported. These include: synthetic polymer materials (polyurethane, polystyrene, polycaprolactone and polyamide-6) with encapsulated photosensitizers [e.g., free-base or zinc tetraphenylporphyrin, zinc phthalocyanine, cationic 5,10,15,20-tetrakis(1-methylpyridinium-4-yl)porphyrin (TMPyP)] that exhibit photobactericidal (*E. coli*) and photovirucidal (against non-enveloped polyomavirus and enveloped baculovirus) efficacy, as well as natural polymer materials based on cellulose nanocrystals (Por$^{(+)}$-CNCs), cellulose fibers (Por$^{(+)}$-paper), or cotton fabrics that possess broad anti-infective efficacy against both bacteria (e.g., *Staphylococcus aureus*, vancomycin-resistant *Enterococcus faecium*, *Acinetobacter baumannii*, *Pseudomonas aeruginosa*, and *Klebsiella pneumonia*) and viruses (e.g., dengue-1, influenza A, and human adenovirus-5).

Despite the existence of these materials, NFC-PS can be distinguished from these existing compositions. In some aspects, NFC-PS incorporates nanofibrillated cellulose (NFC) scaffold, which has not been reported to be used in antimicrobial materials possibly due to its relatively recent origins compared with cellulose fibers and nanocrystals. Moreover, the relative lack of studies on NFC properties/chemistry in comparison to cellulose nanocrystals and fibers, coupled with the difficulty in making NFC in appreciable quantities that are of a uniform consistency and quality, make NFC a non-obvious choice for a cellulose-based (or natural polymer) scaffold. Finally, previous cellulose-based materials employed a covalent attachment or grafting of the photosensitizer to the cellulose scaffold; here, due to the unique size of cellulose nanofibers, NFC can utilize the nanofiber encapsulation strategy successfully employed with synthetic nanofibers, obviating the need for a tedious covalent synthetic strategy and counterintuitively making NFC more amenable to scale-up in what is a non-obvious approach for cellulose that is unique to NFC.

With the limitations of currently available compositions in mind, described herein are photodynamic compositions that can include a natural polymer scaffold and a photosensitizer, where the photosensitizer can be attached to the natural polymer scaffold. In some embodiments, the photosensitizer can be attached to the natural polymer scaffold by a non-covalent bond. In some embodiments, the non-covalent bond is an electrostatic interaction. In some embodiments the photosensitizer can be attached to the natural polymer scaffold by a covalent bond. The photodynamic compositions provided herein can be biodegradable and/or biocompatible.

The photodynamic compositions can be formulated as a sprayable liquid that can be applied to a coating to a surface of an object or a structure. The photodynamic compositions can be formulated such that the composition can be assimilated into an object or a structure. The photodynamic compositions described herein can be formulated as a 3D printing ink. As such, also provided herein are objects and structures that can have a surface coating of a photodynamic composition provided herein. Also provided are objects and structures that have a photodynamic composition that is assimilated therein.

Natural Polymer Scaffolds

The photodynamic composition can contain one or more natural polymer scaffolds. The natural polymer scaffold(s) can contain nanofibrillated cellulose, nanocrystalline cellulose, cellulose fibers, starch, lignin, chitosan, nanofibrillated chitosan, poly-glucosamine, and/or any permissible combinations thereof. The natural polymer scaffolds can have any molecular weight needed, for example, to obtain the desired properties of the photodynamic composition. The natural polymer scaffold can have a molecular weight from about 100 Da to 100,000 kDa or more. The natural polymer scaffold can be included in the photodynamic composition at about 0.001 wt % to about 99.9 wt % of the total photodynamic composition. The natural polymer scaffold can have a net positive charge, a net negative charge, or a net neutral charge. The surface charge density of the natural polymer scaffold can range from about 0 to about +1 charge per D-glucose monomer for the positively charged scaffold, or range from about 0 to −1 charger per D-glucose monomer for the negatively charged scaffold. In some embodiments where the natural polymer scaffold can be or can include nanofibrillated cellulose, the hydrophobic to hydrophilic ratio can vary with wetting contact angles ranging from $0<\theta<180°$.

In embodiments, the natural polymer scaffold can be nanocrystalline cellulose, cellulose fibers, lignin, chitin, chitosan, nanofibrillated chitosan, poly-glucosamine, poly-lactic acid, wool, silk, cotton, and any permissible combinations thereof. The natural polymer scaffold can be negatively functionalized.

The natural polymer scaffold can further include an additive. Suitable additives can include, but are not limited to, acrylic polymers, acrylic co-polymers, acrylic emulsion polymers, acrylic co-polymer emulsions. In some aspects the additive is NeoCryl XK-98. Other additives can include, but not limited to, pigments, stabilizers, driers, thickeners, preservatives, dispersants, silicones, thixotropic agents, photoinitiators for light curable coatings (e.g. camphorquinone), and anti-settling agents. In some aspects, the additive can surface modify the natural polymer scaffold as described below. The additive can be incorporated with the natural polymer scaffold at a ratio of natural polymer scaffold:additive (wt:wt based upon dry solids) that can range from about 51:49 to about 99.9:0.1 and any range in between. In some aspects, the additive can be incorporated with the natural polymer scaffold at a ratio of natural polymer scaffold:additive (wt:wt based upon dry solids) that can be about 51:49; 55:45; 60:40; 65:35; 70:30; 75:25; 80:20; 85:15; 90:10; 95:5; 99; 1.

In addition to the natural polymer scaffold described above, the photodynamic composition can include an additional polymer, which may or may not be the same as an additive. The additional polymer can be natural or synthetic. The additional polymer can polymerize with or be otherwise coupled to the natural polymer scaffold described above. The additional polymer can be included in the photodynamic composition at 0% to about 95% of the total photodynamic composition. The additional polymer can have a molecular weight from about 100 Da to 100,000 kDa or more.

Suitable additional polymers include, but are not limited to: chitosan, natural rubber, lignin, poly-glucosamine, epoxy resins, cellulosic polymers such as starch and polysaccharides; hydrophilic polypeptides; poly(amino acids) such as poly-L-glutamic acid (PGS), gamma-polyglutamic acid, poly-L-aspartic acid, poly-L-serine, or poly-L-lysine; polyalkylene glycols and polyalkylene oxides such as polyethylene glycol (PEG), polypropylene glycol (PPG), and poly (ethylene oxide) (PEO); poly(oxyethylated polyol); poly (olefinic alcohol); polyvinylpyrrolidone); poly (hydroxyalkylmethacrylamide); poly (hydroxyalkylmethacrylate); poly(saccharides); poly (hydroxy acids); poly(vinyl alcohol), and copolymers thereof; polyhydroxy acids such as poly(lactic acid), poly (glycolic acid), and poly(lactic acid-co-glycolic acids); polyhydroxyalkanoates such as poly3-hydroxybutyrate or poly4-hydroxybutyrate; polycaprolactones; poly(orthoesters); polyanhydrides; poly(phosphazenes); poly(lactide-co-caprolactones); polycarbonates such as tyrosine polycarbonates; polyamides (including synthetic and natural polyamides), polypeptides, and poly(amino acids); polyesteramides; polyesters; poly(dioxanones); poly(alkylene alkylates); hydrophobic polyethers; polyurethanes; polyetheresters; polyacetals; polycyanoacrylates; polyacrylates; polymethylmethacrylates; polysiloxanes; poly(oxyethylene)/poly(oxypropylene) copolymers; polyketals; polyphosphates; polyhydroxyvalerates; polyalkylene oxalates; polyalkylene succinates; poly(maleic acids), as well as copolymers thereof. In certain embodiments, the hydrophobic polymer is an aliphatic polyester; polyamides, polycarbonates, polyalkylenes, polyalkylene glycols, polyalkylene oxides, polyalkylene terephthalates, polyvinyl alcohols, polyvinyl ethers, polyvinyl esters, polyvinyl halides, polyvinylpyrrolidone, polyglycolides, polysiloxanes, polyurethanes and copolymers thereof, alkyl cellulose such as methyl cellulose and ethyl cellulose, hydroxyalkyl celluloses such as hydroxypropyl cellulose, hydroxy-propyl methyl cellulose, and hydroxybutyl methyl cellulose, cellulose ethers, cellulose esters, nitro celluloses, cellulose acetate, cellulose propionate, cellulose acetate butyrate, cellulose acetate phthalate, carboxylethyl cellulose, carboxylmethyl cellulose, cellulose triacetate, cellulose sulphate sodium salt, polymers of acrylic and methacrylic esters such as poly (methyl methacrylate), poly(ethylmethacrylate), poly(butylmethacrylate), poly(isobutylmethacrylate), poly(hexylmethacrylate), poly(isodecylmethacrylate), poly(lauryl methacrylate), poly (phenyl methacrylate), poly(methyl acrylate), poly(isopropyl acrylate), poly(isobutyl acrylate), poly(octadecyl acrylate), polyethylene, polypropylene poly(ethylene glycol), poly(ethylene oxide), poly(ethylene terephthalate), poly(vinyl alcohols), poly(vinyl acetate, poly vinyl chloride polystyrene and polyvinylpyrrolidone, derivatives thereof, linear and branched copolymers and block copolymers thereof, and blends thereof. Exemplary biodegradable polymers include polyesters, poly(ortho esters), poly(ethylene imines), poly(caprolactones), poly(hydroxyalkanoates), poly(hydroxyvalerates), polyanhydrides, poly(acrylic acids), polyglycolides, poly(urethanes), polycarbonates, polyphosphate esters, polyphosphazenes, derivatives thereof, linear and branched copolymers and block copolymers thereof, and blends thereof.

Suitable additional polymers include, but are not limited to: chitosan, natural rubber, lignin, poly-glucosamine, epoxy resins, cellulosic polymers such as starch and polysaccharides; hydrophilic polypeptides; poly-amino acids, such as poly-L-glutamic acid (PGS), gamma-polyglutamic acid, poly-L-aspartic acid, poly-L-serine, or poly-L-lysine; polyalkylene glycols and polyalkylene oxides such as polyethylene glycol (PEG), polypropylene glycol (PPG), and poly-ethylene oxide (PEO); polyoxyethylated polyol; polyolefinic alcohol; polyvinylpyrrolidone; polyhydroxyalkylmethacrylamide; polyhydroxyalkylmethacrylate; polysaccharides; polyhydroxy acids; polyvinyl alcohol, and copolymers thereof; polyhydroxy acids such as polylactic acid, polyglycolic acid, and polylactic acid-co-glycolic acids; polyhydroxyalkanoates such as poly3-hydroxybutyrate or poly4-hydroxybutyrate; polycaprolactones; polyorthoesters; polyanhydrides; polyphosphazenes; polylactide-co-caprolactones; polycarbonates such as tyrosine polycarbonates; polyamides (including synthetic and natural polyamides), polypeptides, and polyamino acids; polyesteramides; polyesters; polydioxanones; polyalkylene alkylates; hydrophobic polyethers; polyurethanes; polyetheresters; polyacetals; polycyanoacrylates; polyacrylates; polymethylmethacrylates; polysiloxanes; polyoxyethylene/polyoxypropylene copolymers; polyketals; polyphosphates; polyhydroxyvalerates; polyalkylene oxalates; polyalkylene succinates; polymaleic acids, as well as copolymers thereof. In certain embodiments, the hydrophobic polymer is an aliphatic polyester; polyamides, polycarbonates, polyalkylenes, polyalkylene glycols, polyalkylene oxides, polyalkylene terephthalates, polyvinyl alcohols, polyvinyl ethers, polyvinyl esters, polyvinyl halides, polyvinylpyrrolidone, polyglycolides, polysiloxanes, polyurethanes and copolymers thereof, alkyl cellulose such as methyl cellulose and ethyl cellulose, hydroxyalkyl celluloses such as hydroxypropyl cellulose, hydroxy-propyl methyl cellulose, and hydroxybutyl methyl cellulose, cellulose ethers, cellulose esters, nitro celluloses, cellulose acetate, cellulose propionate, cellulose acetate butyrate, cellulose acetate phthalate, carboxylethyl cellulose, carboxylmethyl cellulose, cellulose triacetate, cellulose sulphate sodium salt, polymers of acrylic and methacrylic esters such as poly methyl methacrylate, polyethylmethacrylat), polybutylmethacrylate, polyisobutylmethacrylate, polyhexylmethacrylate, polyisodecylmethacrylate, polylauryl methacrylate, poly phenyl methacrylate, polymethyl acrylate, polyisopropyl acrylate, polyisobutyl acrylate, polyoctadecyl acrylate, polyethylene, polypropylene polyethylene glycol, polyethylene oxide, polyethylene terephthalate, polyvinyl alcohols, polyvinyl acetate, poly vinyl chloride polystyrene and polyvinylpyrrolidone, derivatives thereof, linear and branched copolymers and block copolymers thereof, and blends thereof. Exemplary biodegradable polymers include polyesters, polyortho esters, polyethylene imines, polycaprolactones, polyhydroxyalkanoates, polyhydroxyvalerates, polyanhydrides, polyacrylic acids, polyglycolides, polyurethanes, polycarbonates, polyphosphate esters, polyphosphazenes, derivatives thereof, linear and branched copolymers and block copolymers thereof, and blends thereof.

In further embodiments, suitable synthetic polymers according to the present disclosure include bisphenol A glycerolate dimethacrylate (Bis-GMA), bisphenol A ethoxylate dimethacrylate (Bis-EMA), urethane-dimethacrylate monomer (UDMA) and/or triethylene glycol dimethacrylate (TEGDMA), derivatives thereof, linear and branched copolymers and block copolymers thereof, and blends thereof.

Additional photosensitizers can be attached to the additional polymers. The additional photosensitizer can be attached via a covalent or a non-covalent bond to the additional polymers. The additional photosensitizers can be cationic, anionic, or neutral. Suitable photosensitizers are described elsewhere herein.

The natural polymer scaffold can be surface modified. The natural polymer scaffold can be surface modified to be cationic and/or at least contain more positively charged moieties than a non-surface modified natural polymer scaffold. Natural polymer scaffolds that are surface modified to be cationic and/or at least contain more positively charged moieties than a non-surface modified natural polymer scaffold can have an increased and/or strengthened electrostatic interaction between an anionic photosensitizer and the natural polymer scaffold as compared to a non-surface modified natural polymer scaffold. The natural polymer scaffold can be surface modified to be anionic and/or at least contain more negatively charged reactive groups than a non-surface modified natural polymer scaffold. Natural polymer scaffolds that are surface modified to be cationic and/or at least contain more negatively charged moieties than a non-surface modified natural polymer scaffold can have an increased and/or strengthened electrostatic interaction between a cationic photosensitizer and the natural polymer scaffold as compared to a non-surface modified natural polymer scaffold.

Photosensitizers

The photodynamic compositions provided herein can also include one or more photosensitizers. The photosensitizer can be attached to the natural polymeric scaffold. In some embodiments the photosensitizer can be attached to the natural polymeric scaffold by a non-covalent bond. The non-covalent bond can be an electrostatic interaction, a hydrogen-bonding interaction, or a hydrophobic interaction. In some embodiments, the photosensitizer can be attached to the natural polymeric scaffold by a covalent bond. In some embodiments where more than one photosensitizer is attached to the natural polymeric scaffold, at least one photosensitizer can be non-covalently attached to the natural polymeric scaffold and at least one photosensitizer can be covalently attached to the natural polymeric scaffold. The photosensitizer can be included in the photodynamic composition at about 0.001 wt % to about 50 wt % and any amount or range of amounts in between. In some aspects, the photosensitizer can be incorporated at about 0.01 to about 0.1 wt % and any amount or range of amounts in between. In some aspects the photosensitizer can be incorporated at about 0.05 wt %.

The photosensitizer can be positively charged. Suitable positively charged photosensitizers include, but are not limited to: positively charged porphyrins (e.g. Por$^{(+)}$, 5,10,15,20-tetrakis(1-methyl-4-pyridinyl)porphyrin tetratosylate, 5,10,15,20-tetrakis(4-N,N,N-trimethylanilinium)porphyrin tetrachloride), positively charged phthalocyanines, positively charged BODIPY based compounds (e.g., DIMPy-BODIPY), positively charged chlorins, positively charged bacteriochlorins, positively charged anthocyanins, positively charged rose bengal, positively charged phenothiazine derivatives (e.g., methylene blue), positively charged metallated derivatives (e.g. TMPyP-Zn), and any permissible combinations thereof.

The photosensitizer can be negatively charged. Suitable negatively charged photosensitizers include, but are not limited to: negatively charged porphyrins (e.g., 5,10,15,20-tetrakis(4-sulphonatophenyl)porphyrin, 5,10,15,20-tetrakis (4-carboxyphenyl)porphyrin-Pd(II)), negatively charged phthalocyanines (phthalocyanine tetrasulphonic acid), negatively charged BODIPY based compounds, negatively charged chlorins, negatively charged bacteriochlorins, negatively charged anthocyanins, negatively charged rose bengal, negatively charged methylene blue and related phenothiazine derivatives, negatively charged metallated derivatives, and any permissible combinations thereof.

The photosensitizer can be neutral. Suitable neutral photosensitizers include, but are not limited to: neutral porphyrins (e.g., tetraphenylporphyrin), neutral phthalocyanines, neutral BODIPY based compounds (e.g., 4,4-difluoro-4-bora-3a,4a-diaza-s-indacene), neutral chlorins, neutral bacteriochlorins, neutral anthocyanins, neutral rose bengal (e.g. methyl ester of rose bengal), neutral phenothiazines, neutral metallated derivatives, and any permissible combinations thereof.

Methods of Making the Photodynamic Compositions

Photodynamic compositions can be made by a covalent attachment of the photosensitizer to the polymer, including but not limited to esterification, copper-catalyzed alkyne-azide cycloaddition reactions ("Click" chemistry, Huisgen cyclization), ether bond linkages, amide bond linkages, coupling reactions (e.g., Sonagashira, Kumada, Heck, Nigishi, Stille, Suzuki), and bioconjugations reactions (e.g., amine-reactive succinimidyl esters/NHS-ester, cysteine-maleimide, cysteine-iodoacetamide, disulfide bond formation, tyrosine diazonium salt, native chemical ligation, Staudinger ligation, modification of ketones and aldehydes, N-terminal aldehyde). Photodynamic compositions may also be made by non-covalent attachments, including but not limited to electrostatic attachment (e.g., ion-ion, ion-dipole interactions, dipole-dipole interactions/hydrogen-bonding), hydrophobic interactions, and physical encapsulations methods. Electrostatic ion-ion attachment of an ionic photosensitizer with an ionic polymer includes positively charged photosensitizers that are mixed with polymers bearing negatively charged functional groups, or negatively charged photosensitizers mixed with polymers bearing positively charged functional groups. Electrostatic ion-dipole attachment includes positively or negatively charged photosensitizers that are mixed with polymers possessing permanent dipoles, or photosensitizers possessing permanent dipoles mixed with polymers bearing positively or negatively charged functional groups. Electrostatic dipole-dipole (e.g., hydrogen bonding) attachment includes photosensitizers possessing permanent dipoles that are mixed with polymers possessing permanent dipoles. Hydrophobic interaction attachment includes hydrophobic (e.g., non-polar) photosensitizers that are mixed with hydrophobic (e.g., non-polar) polymers. Physical encapsulations methods include the physical trapping/caging of the photosensitizer within the polymer matrix.

Methods of Using the Photodynamic Compositions

The photodynamic compositions described herein can have use in a wide variety of applications where microbial control, microbial reduction, disinfection and/or sterilization is desired. Generally speaking, the photodynamic compositions provided herein can be coated onto or assimilated into a range of materials, thereby creating novel renewable, biodegradable, anti-infective consumer staples. The photodynamic compositions can be applied as coating to a surface of an object or a structure. The photodynamic composition can be applied as a coating to a surface of an object or a structure by spraying, painting, or otherwise depositing the photodynamic composition to the surface of the object or the structure.

For example the photodynamic compositions provided herein can be used as a paint-like spray coating (walls, draperies, blinds) for pathogen reduction/antimicrobial applications in hospitals and related healthcare settings; assimilated into textiles for sterile hospital gowns/masks, hospital linens, and patient garments; assimilated in seat fabrics, seatback trays, and other areas in high density transportation fields (airplanes, trains, subways, public restrooms), with further application in the space industry; blended and/or applied as a film to the polycarbonate shells in neonatal intensive care units, indwelling catheters, bandages for continuous light-activated sterilization of wounds (particularly for burn victims), or for treatment of medical waste; applied as film to cover touchscreens for computers, airport check-in kiosks, and smart devices (phones, tablets, etc.); used as an anti-mold wallpaper for basements and crawl spaces; coated onto paper or plastics for antimicrobial packaging for food storage, safety, preparation, and handling; assimilated into, formed as, or applied as a coating to filters for flow-sterilization applications of municipal water sources. In some instances, the photodynamic compositions provided herein can be applied to a surface of an object or a structure via 3-D printing.

Printing Ink Formulations

In embodiments, described herein are printing ink formulations, for example two-dimensional printing ink formulations (for example suitable as ink jet formulations or textile ink formulations for inkjet printers). The inkjet formulations as described herein (also referred to herein as textile ink formulations) may be used for inkjet printing, silk screening, gravure printing, dip and nip methods and the like. The textile ink compositions as described herein are capable of durably dyeing a number of both natural and synthetic fabrics, such as cotton, silk, linen, rayon, nylon, polyester and so forth.

In embodiments, ink jet formulations as described herein can comprise a natural polymer scaffold and a photosensitizer. In embodiments, the natural polymer scaffold is nanofibrillated cellulose. In embodiments, the natural polymer scaffold can be nanocrystalline cellulose, cellulose fibers, lignin, chitin, chitosan, nanofibrillated chitosan, poly-glucosamine, polylactic acid, wool, silk, cotton, and any permissible combinations thereof. The natural polymer scaffold can be negatively functionalized. In inkjet formulations as described herein, the photosensitizer can be attached to the natural polymer scaffold by a covalent bond or non-covalent (for example an electrostatic interaction, hydrogen-bonding interaction, or a hydrophobic interaction). The photosensitizer can be a positively-charged, negatively-charged, or neutral photosensitizer as described herein (examples of which provided in other sections of the present disclosure). The natural polymer scaffold can be positively or negatively functionalized. Ink jet formulations as described herein can further comprise a synthetic polymer (examples of which provided in other sections of the present disclosure). Ink jet formulations as described herein can further comprise a second photosensitizer, wherein the second photosensitizer is attached to the synthetic polymer by a covalent or non-covalent interaction. Inkjet formulations as described herein can further comprise an additive, for example acrylic polymers, acrylic co-polymers, acrylic emulsion polymers, and acrylic co-polymer emulsions. In embodiments, the additive comprises acrylic emulsion polymers or acrylic co-polymer emulsions.

In embodiments, the textile ink composition may further comprise an irreversible polymeric cationic dye complex formed between a cationically charged metal oxide and a dye.

In embodiments, the metal oxide may be any cationic metal oxide, but in certain embodiments can be an alumina oligomer, for example an oligomeric aluminum chlorohydrate (also known as aluminum chlorohydrol).

In embodiments, the dye comprises anthraquinone, catechol, hydroxyazo or salicylic acid groups. Such dyes can comprise Carminic Acid, Alizarin Red, Acid Blue 45, Acid Green 41, Hematoxylin, Chromoxane Cyanine R, Calconcarboxylic Acid, Plasmocorinth B, Pyrocatechol and Acid Alizarin Violet N. Mordant dyes known to form highly colored complexes with chromium, such as Mordant Yellow 12 and Mordant Blue 9, are also suitable dyes.

In general, the ratio of alumina oligomer:dye molecule can be in the range of from about 0.1:10 to 10:1, more particularly from about 0.5:1 to 5:1 and most particularly about one alumina oligomer per dye molecule.

The composition may further include one or more ink jet additives such as known polyols, viscosity modifiers, non-ionic surfactants to reduce surface tension, drying preventing agents, penetration accelerators, ultraviolet light absorbers, antioxidants, antifungal agents, pH adjusters, antifoaming agents, dispersion aids, dispersion stabilizers, antirusting agents, chelating agents and the like.

In additional embodiments, described herein are three-dimensional printing ink formulations.

In embodiments, three-dimensional printing ink formulations as described herein can comprise a natural polymer scaffold and a photosensitizer. In embodiments, the natural polymer scaffold can be nanocrystalline cellulose, cellulose fibers, lignin, chitin, chitosan, nanofibrillated chitosan, polyglucosamine, polylactic acid, wool, silk, cotton, and any permissible combinations thereof. The natural polymer scaffold can be negatively functionalized. In embodiments, the natural polymer scaffold is nanofibrillated cellulose. In three-dimensional printing ink formulations as described herein, the photosensitizer can be attached to the natural polymer scaffold by a covalent bond or non-covalent (for example an electrostatic interaction, hydrogen-bonding interaction, or a hydrophobic interaction). The photosensitizer can be a positively-charged, negatively-charged, or neutral photosensitizer as described herein (examples of which provided in other sections of the present disclosure). The natural polymer scaffold can be positively or negatively functionalized. Three-dimensional printing ink formulations as described herein can further comprise a synthetic polymer (examples of which provided in other sections of the present disclosure). Three-dimensional printing ink formulations as described herein can further comprise a second photosensitizer, wherein the second photosensitizer is attached to the synthetic polymer by a covalent or non-covalent interaction. Three-dimensional printing ink formulations as described herein can further comprise an additive, for example acrylic polymers, acrylic co-polymers, acrylic emulsion polymers, and acrylic co-polymer emulsions. In embodiments, the additive comprises acrylic emulsion polymers or acrylic co-polymer emulsions.

Three-dimensional printing ink formulations can further comprise a photocurable material. In embodiments, the photocurable material may include one or more selected from the group consisting of acrylate-based and methacrylate-based compounds having one or more unsaturated functional groups.

In embodiments, the photocurable material may include one or more selected from the group consisting of a hydroxyl group-containing acrylate-based compound, a water-soluble acrylate-based compound, a polyester acrylate-based compound, a polyurethane acrylate-based compound, an epoxy acrylate-based compound and a caprolactone-modified acrylate-based compound.

Three-dimensional printing ink formulations can further comprise a photoinitiator. In embodiments, the photoinitiator may include a compound which generates radicals by radiation of ultraviolet (UV) or visible light. In embodiments, the photoinitiator may include one or more selected from the group consisting of an α-hydroxyketone-based photocuring agent, a phenylglyoxylate-based photocuring agent, a bisacylphosphine-based photocuring agent and an α-aminoketone-based photocuring agent.

In embodiments, three-dimensional printing ink formulations as described herein may include: the surface-modified inorganic particles at 5 to 50 wt %; the photocurable material at 35 to 85 wt %; and the photoinitiator at 1 to 15 wt %.

Three-dimensional printing ink formulations can further comprise a coloring agent. In embodiments, the coloring agent may include one or more selected from the group consisting of a dye, a pigment, a self-dispersing pigment, and a mixture thereof.

Three-dimensional printing ink formulations can further comprise an organic solvent. In embodiments, the organic solvent may include one or more selected from the group consisting of an alcohol compound, a ketone compound, an ester compound, a polyhydric alcohol compound, a nitrogen-containing compound and a sulfur-containing compound.

EXAMPLES

Now having described the embodiments of the present disclosure, in general, the following Examples describe some additional embodiments of the present disclosure. While embodiments of the present disclosure are described in connection with the following examples and the corresponding text and figures, there is no intent to limit embodiments of the present disclosure to this description. On the contrary, the intent is to cover all alternatives, modifications, and equivalents included within the spirit and scope of embodiments of the present disclosure.

Example 1

Recently, a photoactive material, termed Paper-por has been described. See Carpenter et al., Biomacromolecules. 2015. 16:2482-2492, the entirety of which is incorporated herein by reference as if expressed in its entirety. In the Paper-por material, a porphyrin-based photosensitizer Por$^{(+)}$ is covalently attached to cellulose fibers. Paper-por material was demonstrated to be effective against *Staphylococcus aureus*, vancomycin-resistant *Enterococcus faecium*, *Acinetobacter baumannii*, *Pseudomonas aeruginosa*, and *Klebsiella pneumoniae*, with inactivation of all bacterial strains studied by 99.99+%. Paper-Por was also found to inactivate dengue-1 virus (>99.995%), influenza A (~99.5%), and human adenovirus-5 (~99%) all to a high level. As such, the Paper Por material demonstrates that cellulose fibers that are attached to a photosensitizer can be effective at killing a large variety of microbes.

In this Example a simplified strategy of embedding photosensitizers into polymers that does not rely on the covalent attachment of the photosensitizer to the scaffold used in Paper-por is demonstrated. More specifically, this Example at least demonstrates using polyacrylonitrile (PAN) to make PAN-Por, an electrospun non-woven textile having an encapsulated photosensitizer (Por$^{(+)}$).

Materials and Methods

Buffer salts were purchased from Fisher Scientific, Nutrient Broth #234000 was obtained from BD Difco, LB broth Miller from EMD Chemicals, and Tryptic Soy Broth from Teknova. Unless otherwise specified, all other chemicals were obtained from commercial sources in reagent grade purity or better. Deionized water used for all media and buffers. UV-visible absorption measurements were performed on a Varian Cary 50 Bio instrument or a Genesys 10 UV scanning spectrophotometer from Thermo Electron Corp for single wavelength measurements. The photosensitizer Por$^{(+)}$ was synthesized as described previously (Feese, E.; Sadeghifar, H.; Gracz, H. S.; Argyropoulos, D. S.; Ghiladi, R. A. Photobactericidal porphyrin-cellulose nanocrystals: synthesis, characterization, and antimicrobial properties. *Biomacromolecules* 2011, 12, 3528-3539; Carpenter, B. L.; Feese, E.; Sadeghifar, H.; Argyropoulos, D. S.; Ghiladi, R. A. Porphyrin-cellulose nanocrystals: a photobactericidal material that exhibits broad spectrum antimicrobial activity. *Photochem. Photobiol.* 2012, 88, 527-536; Feese, E., North Carolina State University, 2011).

Field-emission scanning electron microscopy (FE-SEM, FEI Verios 460L, USA) was performed at an acceleration voltage of 2 kV to observe the morphology of the obtained samples. Thermal gravimetric analysis (TGA) was carried out on a TA instrument TGAQ50 ramping 8° C./min under $N_2$ purging.

Electrospinning of PAN-Por$^{(+)}$: Polyacrylonitrile (PAN, Mw=150,000) and N, N-dimethylformamide (DMF) were purchased from Sigma-Aldrich and used as received. The solution was prepared by firstly dissolving PAN powder into DMF solvent with a weight percentage of 5 wt. %. The PAN/DMF solution was stirred for over 24 hours, followed by the addition of cationic porphyrin (1130 g mol$^{-1}$). The mass of cationic porphyrin was 10 wt. % with respect to the mass of PAN. The solution was further stirred for 24 hours prior to electrospinning. A variable high voltage power supply (Gamma ES40P-20 W/DAM) was used to provide a high voltage (15 kV) for electrospinning. The flow rate applied was 0.75 mL h$^{-1}$. The needle-to-collector distance was set at 15 cm and electrospun fibers were collected on an aluminum foil. Each sample of PAN-Por$^{(+)}$ (~1 mg) was then placed in a 24-well plate and washed 8 times with a minimum of 2 mL deionized water per washing, thereby removing adventitiously bound Por$^{(+)}$ to a concentration of less than 19 nM as determined by UV-visible spectroscopy.

Determination of PAN-Por$^{(+)}$ Porphyrin Loading: ~9 mg of dry, washed textile was dissolved in 4 mL dimethylformamide and 6 mL deionized water, thereby fully solubilizing the Por$^{(+)}$ photosensitizer. The resulting solution was syringe filtered (0.22 μm) to remove any trace undissolved PAN nanofibers, diluted 1:6 with deionized water, and the concentration of the Por$^{(+)}$ was determined by UV-visible spectroscopy using $\varepsilon_{Soret}$=195,000 M$^{-1}$ cm$^{-1}$ (Ghiladi, R. A. Porphyrin-cellulose nanocrystals: a photobactericidal material that exhibits broad spectrum antimicrobial activity. *Photochem. Photobiol.* 2012, 88, 527-536; Feese, E., North Carolina State University, 2011).

Cell culture: All bacteria were grown in 5 mL cultures incubated at 37° C. on an orbital shaker at 500 RPM under the following growth conditions: methicillin susceptible *Staphylococcus aureus* 2913 was grown in tryptic soy broth without antibiotics; vancomycin resistant *Enterococcus faecium* (ATCC-2320) was grown in DB Difco Bacto Brain Heart Infusion 237500 with 50 μg/mL ampicillin; *Escherichia coli* BL21-(Dε3)pLysS (Stratagene, USA) was grown in Miller LB media with 100 μg/mL ampicillin; *Acinetobacter baumannii* (ATCC-19606) was grown in Miller LB media without antibiotics. *Klebsiella pneumoniae* (ATCC-2146) was grown in DB Difco Nutrient broth #234000 with 100 μg/mL ampicillin. Each bacterium was grown to a concentration of 1-4×10$^8$ CFU/mL (determined spectrophotometrically from growth curves using a Genesys 10 UV scanning spectrophotometer) prior to being pelleted by centrifugation (15 min, ~4150 g). Once pelleted, the supernatant was decanted and the cells were resuspended in 5 mL of broth media and diluted to ~10$^8$ CFU mL$^{-1}$ (determined spectrophotometrically).

Viral Propagation: Vesicular stomatitis virus (VSV) NJ strain was propagated on Vero cells and titered by plaque assay on Vero cells. Human adenovirus-5 (HAd-5) was propagated on the human lung carcinoma cell line A549 and titered on the same cells. Plaques were visualized by crystal violet staining.

Photodynamic Inactivation Assay: All photosensitization experiments were performed using a non-coherent light source, PDT light model LC122 (LumaCare, USA), equipped with a LUM V fiber optic probe (400-700 nm band pass filter, average transmittance T$_{avg}$~95±3%) and an OSRAM Xenophot lamp model 64653 HLX (24 V, 250 W). The fluence rate was measured with an Orion power meter (Ophir Optronics Ltd, Israel). All experiments were conducted in triplicate at a minimum, and statistical significance was assessed via a two-tailed, unpaired Student's t-test.

Bacteria: a sterile 24-well plate (BD Falcon, flat bottom) was prepared with PAN-Por$^{(+)}$ cut to precisely fit the well bottom (~1 cm diam.) using a custom hole punch. Aliquots (100 μL) of cell culture were transferred to each well and illuminated with visible light (400-700 nm) with a fluence rate of 65±5 mW/cm$^2$ for a variable period of time (5-60 min) while magnetically stirred. Studies were repeated as described with PAN (PS-free material control), and in the absence of material (cells-only control), under both illuminated and non-illuminated (dark) conditions. After illumination, each well was 1:10 serially diluted five times. 10 μL from the undiluted well and from each dilution, as well as from the dark control, were plated and incubated in the dark at 37° C. Each bacterium was grown on gridded six column square agar plates made with their respective growth media without antibiotics. The survival rate was determined from the ratio of CFU/mL of the illuminated solution versus that of the dark control. The minimum detection limit was 100 CFU/mL (based on 10 μL plated from the 1 mL undiluted well). Variations in the concentration of the starter culture (1-4×10$^8$ CFU/mL) resulted in a variation of the detection limit spanning the region of 0.001-0.0001% survival. Samples with PAN-Por$^{(+)}$ present but kept in the dark (dark control) and illuminated samples of PAN without PS (light control) served as controls.

Vesicular stomatitis virus: 25 μl of a VSV stock (5×10$^8$ plaque forming units (PFU)/ml) were added to either empty well (Control), PAN or PAN-Por$^{(+)}$ in wells of a 96 well plate in the dark prior to 30 min under visible light illumination (400-700 nm; 65±5 mW/cm$^2$). Control experiments were similarly performed in the dark. Treatments were performed in biological triplicates. After illumination 100 μL of MEM supplemented with 10 mM HEPES, 1% FBS and antibiotics were added to wash remaining viruses off the textiles. Virus samples were subsequently titered on Vero cells, and the virus concentration was determined by plaque assay (detection limit of 40 PFU/mL). Specifically, viruses were titered by serial 10-fold dilution on Vero cells in 12-well plates at 37° C. Plaques were detected by crystal violet staining 48 h after infection. Where virus was detectable, the plaques at dilutions where wells contained between 10-30 plaques were counted for titer determination.

Human adenovirus-5: 25 μl of a human adenovirus 5 stock (4.5×10$^7$ PFU/ml) were added to either empty well (Control), PAN or PAN-Por$^{(+)}$ in wells of a 96 well plate in the dark prior to 30 min under visible light illumination (400-700 nm; 65±5 mW/cm$^2$). Treatments were performed in biological triplicates. After illumination 100 μL of DMEM supplemented with 10% FBS and antibiotics were added to wash remaining viruses off the textiles. Control experiments were similarly performed in the dark. Virus was titered by serial 10-fold dilution on A549 cells in 12-well plates at 37° C. Plaques were detected by crystal violet staining 120 h after infection. Where virus was detectable, the plaques at dilutions where wells contained between 10-40 plaques were counted for titer determination.

Results

Figure 1B:
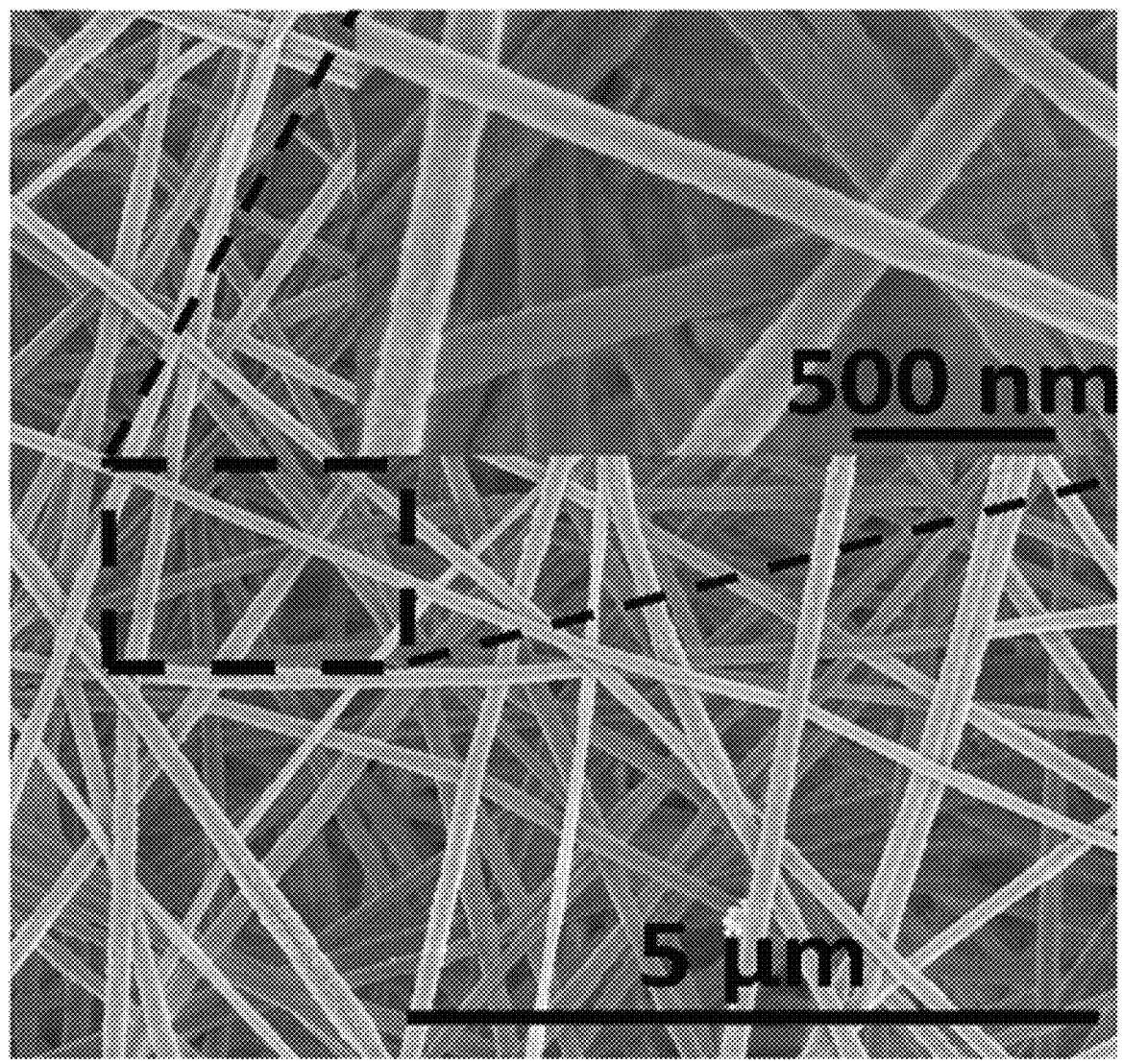
Figure 2:
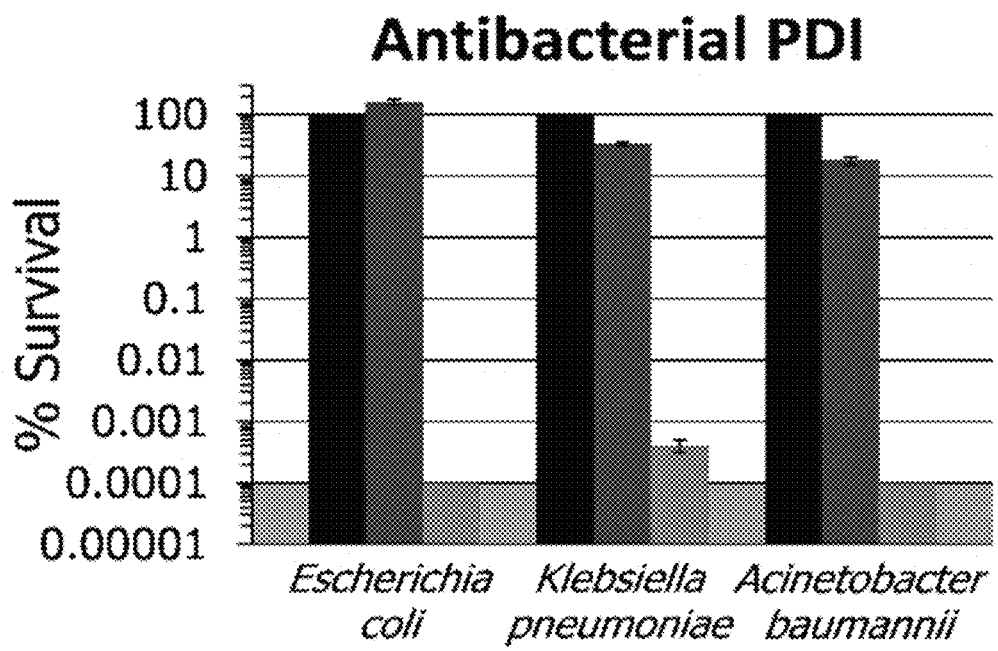
FIG. 2 shows a graph demonstrating an antibacterial effect of the polyacrylonitrile-based photodynamic composition.
Figure 3:
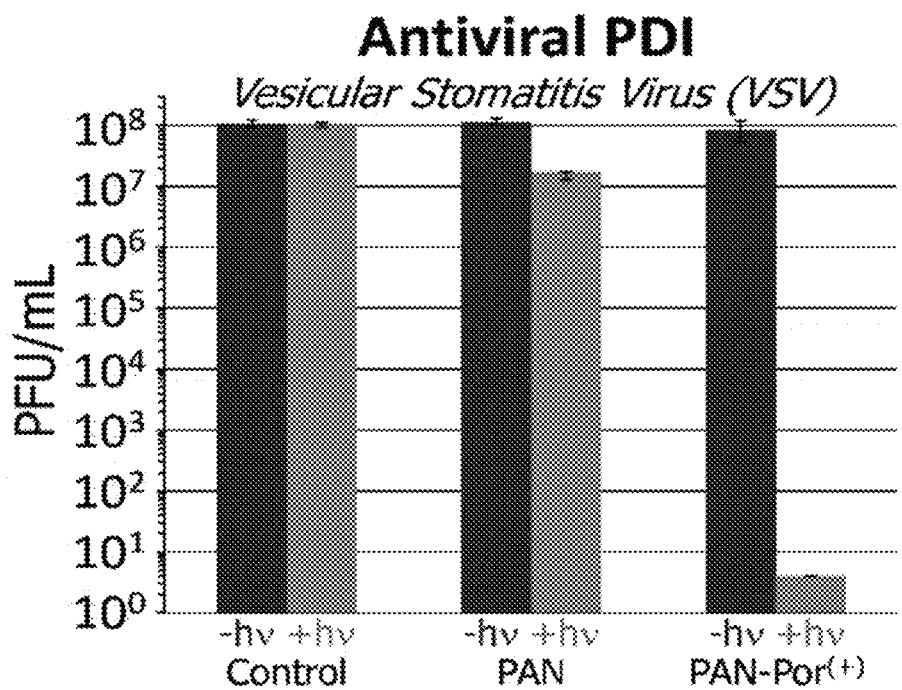
FIG. 3 shows a graph demonstrating an antiviral effect of the polyacrylonitrile-based photodynamic composition.

PAN-Por$^{(+)}$ (FIGS. 1A-1B) was observed to me more effective than Paper-por at killing microbes. See FIGS. 2-3. It was observed that PAN-Por$^{(+)}$ yielded complete killing (about 100%) of *E. coli, A. baumannii,* and *S. aureus,* and 99.9995% reduction of *K. pneumoniae* and *P. aeruginosa* (FIG. 2). In other words, for all strains examined, when starting with 100 million pathogenic cells present prior to light activation, fewer than 500 cells remained viable after only 30 minutes of aPDI treatment. PAN-Por$^{(+)}$ was also found to inactivate vesicular stomatitis virus (>99.9999%) (FIG. 3) and human adenovirus-5 (about 99.5%) (data not shown).

Example 2

NFC-PS takes advantage of both approaches given above, namely combining nanofibrillated cellulose (as a renewable, compostable, and biodegradable biopolymer) with an embedded photosensitizer strategy (thereby minimizing synthesis and allowing for scale-up and the use of commercially available photosensitizers) to create an antimicrobial coating that can be both easy to apply (sprayable, brushable, or can be incorporated into 3D printing technology) and effective against a wide range of pathogens, including bacteria, viruses, and fungi. As opposed to cellulose nanocrystals (Feese, E.; Sadeghifar, H.; Gracz, H. S.; Argyropoulos, D. S.; Ghiladi, R. A. Photobactericidal porphyrin-cellulose nanocrystals: synthesis, characterization, and antimicrobial properties. *Biomacromolecules* 2011, 12, 3528-3539; Carpenter, B. L.; Feese, E.; Sadeghifar, H.; Argyropoulos, D. S.; Ghiladi, R. A. Porphyrin-cellulose nanocrystals: a photobactericidal material that exhibits broad spectrum antimicrobial activity. *Photochem. Photobiol.* 2012, 88, 527-536) or fibers (Carpenter, B. L.; Scholle, F.; Sadeghifar, H.; Francis, A. J.; Boltersdorf, J.; Weare, W. W.; Argyropoulos, D. S.; Maggard, P. A.; Ghiladi, R. A. Synthesis, Characterization, and Antimicrobial Efficacy of Photomicrobicidal Cellulose Paper. *Biomacromolecules* 2015, 16, 2482-2492), the use of nanofibrillated cellulose (NFC) is due to its attractive high surface area characteristics whose gelatinous nature makes it amenable to being readily applied on the surfaces of materials. However, this nanofibrillated cellulose is relatively new (as compared to cellulose fibers and cellulose nanocrystals) and its laborious and comparatively difficult production (as compared to cellulose fibers and cellulose nanocrystals) has directed away from its use as a scaffold material in this context. In this example a NFC-MB compositions was generated to demonstrate the feasibility of NFC as a scaffold material for use in a photodynamic composition.

Materials and Methods

Preparation of NFC-MB: To a suspension of 30.0 grams TEMPO-oxidized nanofibrillated cellulose (0.5 wt % in water) was added 30 mg methylene blue pre-dissolved in 5 mL water. The mixture was stirred vigorously for 10 minutes, and then poured into a square petri dish. The water was allowed to evaporate at room temperature for three days, after which NFC-MB formed as a thin film that was easily removed from the petri dish.

Photodynamic Inactivation Assay: All photosensitization experiments were performed using a non-coherent light source, PDT light model LC122 (LumaCare, USA), equipped with a LUM V fiber optic probe (400-700 nm band pass filter, average transmittance $T_{avg}$~95±3%) and an OSRAM Xenophot lamp model 64653 HLX (24 V, 250 W). The fluence rate was measured with an Orion power meter (Ophir Optronics Ltd, Israel).

Bacteria testing: Two pieces of NFC-MB were cut to precisely fit the bottom (~1 cm diam.) of a 24-well plate using a custom hole punch, and were illuminated as described above under the Photodynamic Inactivation Assay. Each NFC-MB was then swabbed with a sterile cotton applicator, and the cotton transferred to a culture tube into which bacterial culture medium was added (either as LB or TSB). After agitation, 10 µL from each culture tube was plated directly on gridded six column square agar plates made with their respective growth media without antibiotics. The remaining culture solutions were incubated at 37° C. for one, and an additional 10 µL from each culture tube was plated on a second set of gridded six column square agar plates. The plates were grown overnight at 37° C. and subjected to colony counting the next day.

Viral testing: Vesicular stomatitis virus: 25 µl of a VSV stock (5×10$^8$ plaque forming units (PFU)/ml) were added to either empty well (Control), or disks of NFC, NFC TMPyP or NFC MB) in wells of a 96 well plate in the dark prior to 30 min under visible light illumination (400-700 nm, 65±5 mW/cm$^2$). Control experiments were similarly performed in the dark. Treatments were performed in biological triplicates. After illumination 100 µL of MEM supplemented with 10 mM HEPES, 1% FBS and antibiotics were added to wash remaining viruses off the disks. Virus samples were subsequently titered on Vero cells, and the virus concentration was determined by plaque assay (detection limit of 40 PFU/mL). Specifically, viruses were titered by serial 10-fold dilution on Vero cells in 12-well plates at 37° C. Plaques were detected by crystal violet staining 48 h after infection. Where virus was detectable, the plaques at dilutions where wells contained between 10-30 plaques were counted for titer determination.

Results

Figure 4:
FIG. 4 shows a photographic image of NFC-MB formed from the addition of 30 mg MB to 30.0 g 0.5 wt % TEMPO-oxidized NFC in water.
Figure 5A:
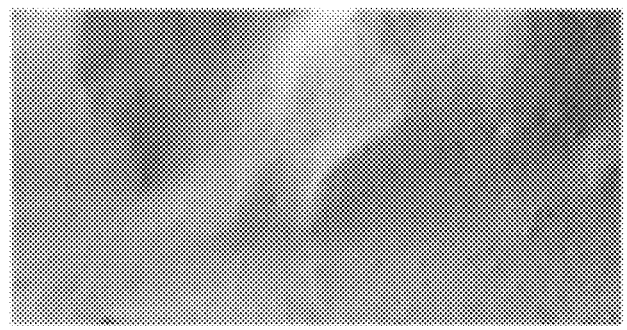
FIGS. 5A-5D show images of the NFC-NeoCryl 80/20 material with 0.05 wt % of various photosensitizers and their relevant structures: none (FIG. 5A); TMPyP-Zn (FIG. 5B); Methylene Blue (FIG. 5C); or BODIPY (FIG. 5D).
Figure 5B:
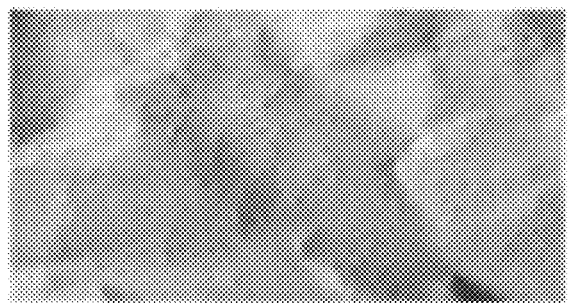
Figure 5B:
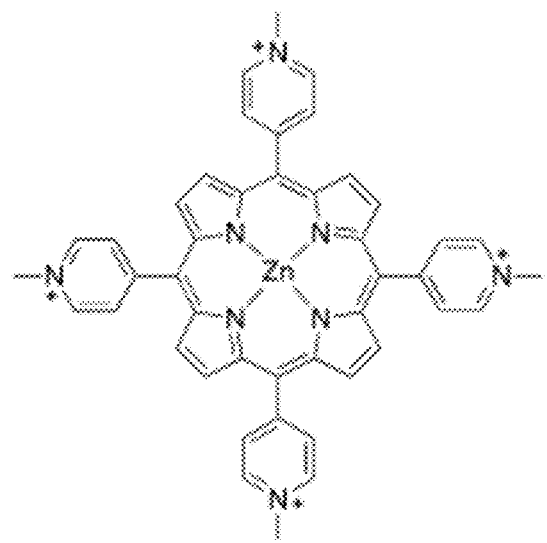
Figure 5C:
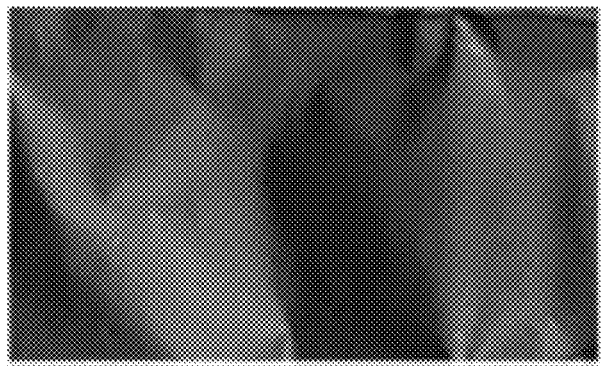
Figure 5C:
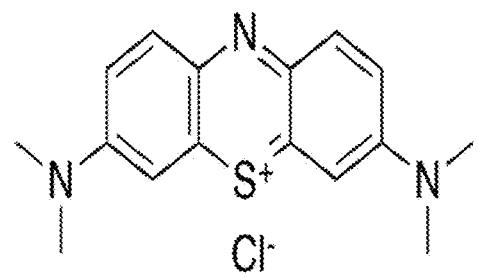
Figure 5D:
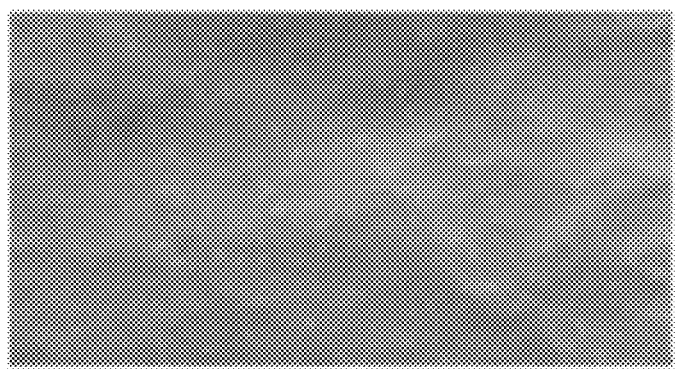
Figure 5D:
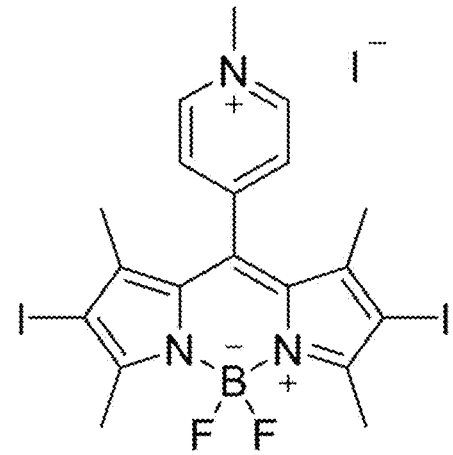

The prepared NFC-MB is demonstrated in FIG. 4. The final composition of the material shown in FIG. 4 was 30 mg MB:150 mg TEMPO-oxidized NFC. In order to assay if the surface of the material was antimicrobial under normal environmental exposure, the material was left open to the atmosphere for 1 month on an office table and lab bench to simulate real world conditions. After illumination for 30 minutes under our standard conditions followed by colony counting, no colonies survived on any plate, regardless of media or growth time.

Example 3

Retention of the PS within the NFC matrix. A formulation containing nanofibrillated cellulose with the additive NeoCryl XK-98 (80:20, wt:wt based upon dry solids, respectively), termed NFC-NeoCryl 80/20 was generated. This formulation was observed to have no significant loss of the PS when exposed to water.

Modulating the spreading characteristics of NFC based coatings. The NFC-NeoCryl 80/20 formulation from TG-Ia shows satisfactory spreading characteristics for application onto a number of substrates, including glass surfaces as well as aluminum, as shown below in TG-Ic.

Variation of the photosensitizer within the NFC matrix. To enhance commercialization, a broad color palette for the NFC-NeoCryl 80/20 can be advantageous (FIGS. 5A-5D). To demonstrate that the NFC-based materials can form a broad color palette for various applications, the following three photosensitizers were incorporated at about 0.01-0.1 wt % into NFC-NeoCryl 80/20 on an aluminum foil backing:
  (1) Green—TMPyP-Zn, a tetracationic porphyrin metallated with zinc to enhance photophysical properties.
  (2) Red—The target BODIPY compound shown in FIG. 5D.
  (3) Blue—Commercially available methylene blue (structure FIG. 5C).

The results are demonstrated in FIGS. 5A-5D.

Example 4

Figure 6:
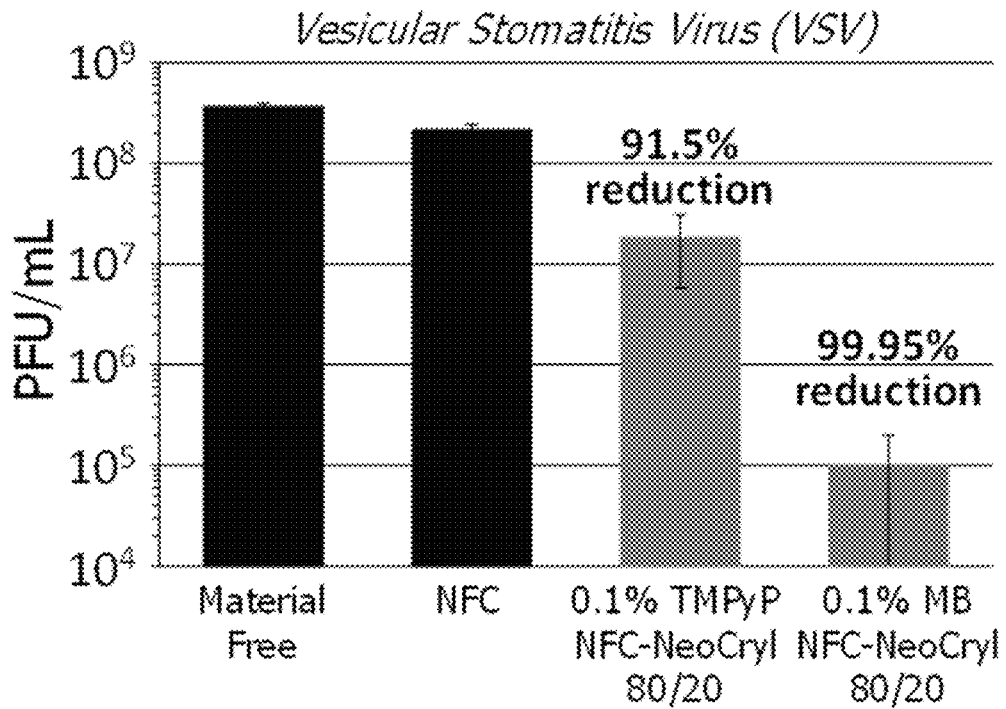
FIG. 6 shows a graph demonstrating the results from antiviral photodynamic inactivation studies against vesicular stomatitis virus (VSV). The black and dark grey bars represent the number of PFU/mL for the following illuminated samples: material-free control, photosensitizer-free NFC control, 0.1 wt % TMPyP in NFC-NeoCryl 80/20, and 0.1 wt % MB in NFC-NeoCryl 80/20. The illumination conditions were as follows: 30 min, 400-700 nm, 65±5 mW/cm$^2$ (total fluence of 118 J/cm$^2$).

Antiviral Studies: Vesicular stomatitis virus (VSV) was chosen for the initial investigation into the antiviral properties of NFC-NeoCryl 80/20. The 0.1 wt % BODIPY material did not exhibit any antiviral activity against VSV. However, upon illumination with visible light (400-700 nm) for 30 minutes, both the 0.1 wt % TMPyP and 0.1 wt % methylene blue materials did show antiviral activity (FIG. 6). Notably, 0.1 wt % TMPyP in NFC-NeoCryl 80/20 showed a 91.5% reduction in infectivity, while 0.1 wt % methylene blue in NFC-NeoCryl 80/20 showed an impressive 99.95% reduction (over 2000-fold) (FIG. 6). No effect was seen in the absence of illumination. Finally, it is important to note that photosensitizer-free NFC was equivalent to the material-free control, demonstrating that the viral particles do not stick to the material.

Example 5

Figure 7A:
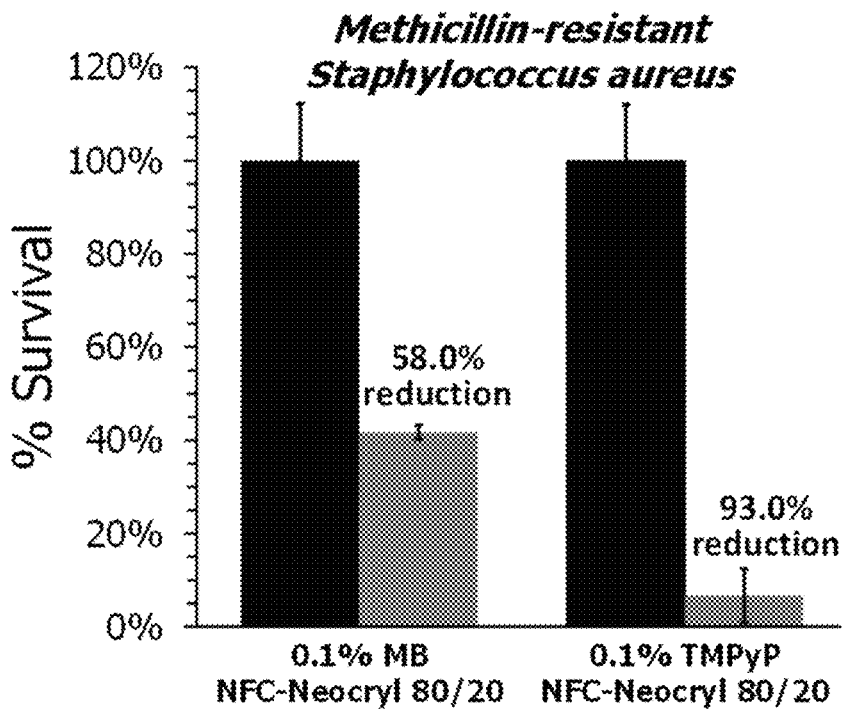
FIGS. 7A-7B show graphs demonstrating the results from Photodynamic inactivation studies employing 0.1 wt % photosensitizer in NFC-NeoCryl 80/20.
Figure 7B:
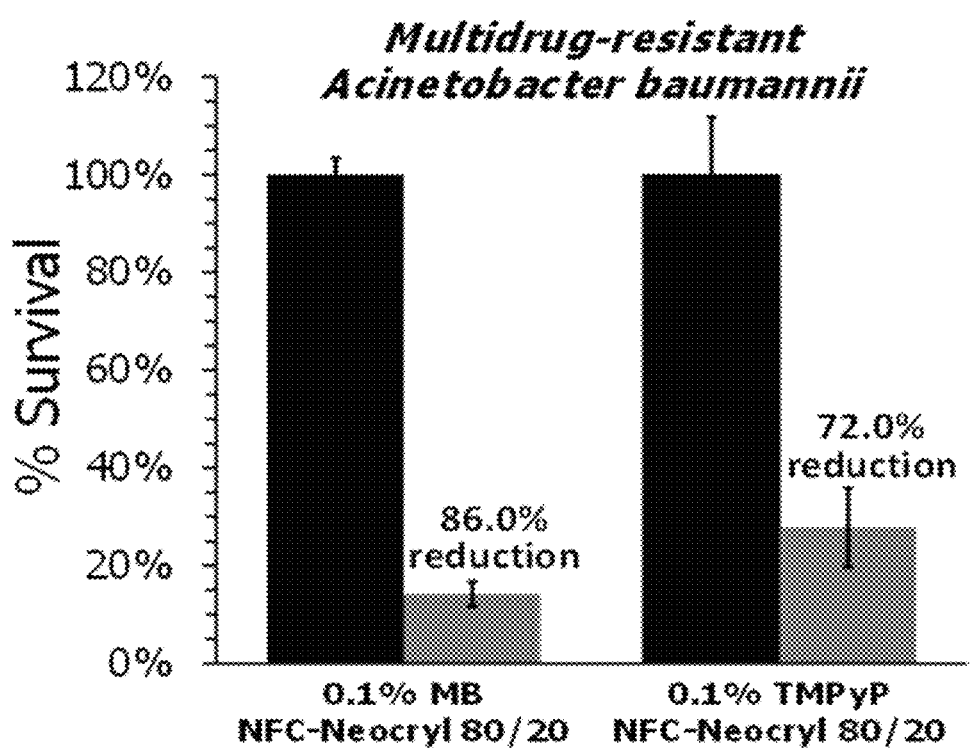

Antibacterial Studies: A multidrug-resistant strain of the Gram-negative bacterium *Acinetobacter baumannii* (MDRAB) and a methicillin-resistant strain of the Gram-positive bacterium *Staphylococcus aureus* (MRSA) were chosen for the initial investigation into the antibacterial properties of NFC-NeoCryl 80/20 (FIGS. 7A-7B).

Methicillin-Resistant *Staphylococcus aureus* (MRSA): 0.1 wt % TMPyP in NFC-NeoCryl 80/20 killed 93% of the bacterium (FIG. 7A) with about 30 minutes illumination with visible light (400-700 nm). Confirming the importance of the cationic charges for the inactivation of bacteria, a control porphyrin without ionic character showed no killing under the same conditions. 0.1 wt % methylene blue in NFC-NeoCryl 80/20 showed about 58% killing.

Multidrug-resistant *Acinetobacter baumannii* (MDRAB): 0.1 wt % TMPyP in NFC-NeoCryl 80/20 killed 72% of the bacterium (FIG. 7B) with about 30 minutes illumination with visible light (400-700 nm). Confirming the importance of the cationic charges for the inactivation of bacteria, the control porphyrin without ionic character showed no killing under the same conditions. 0.1 wt % methylene blue in NFC-NeoCryl 80/20 showed a higher level of killing at 86%.

We claim:

1. A composition comprising:
   a natural polymer scaffold, wherein the natural polymer scaffold is selected from the group consisting of: nanocrystalline cellulose, cellulose fibers, lignin, chitin, chitosan, nanofibrillated chitosan, poly-glucosamine, wool, silk, cotton, and any permissible combinations thereof; and
   a photosensitizer, wherein the photosensitizer is attached to the natural polymer scaffold by a non-covalent bond, wherein the non-covalent bond is an electrostatic interaction, hydrogen-bonding interaction, or a hydrophobic interaction, and wherein the photosensitizer is a positively charged photosensitizer.

2. The composition of claim 1, wherein the natural polymer scaffold is negatively functionalized.

3. The composition of claim 1, further comprising a synthetic polymer.

4. The composition of claim 3, further comprising a second photosensitizer, wherein the second photosensitizer is attached to the synthetic polymer by a covalent or non-covalent interaction.

5. An object or a structure comprising:
   a composition according to claim 1.

6. The object or the structure of claim 5, wherein the composition forms a coating on a surface of the object or the structure.

7. The object or the structure of claim 5, wherein the composition is assimilated into the object or the structure.

8. The object or the structure of claim 5, wherein the object or the structure is a textile.

9. The object or the structure of claim 5, wherein the object or the structure is a container or packaging material.

10. The object or the structure of claim 5, wherein the object or the structure is a wall, celling, or floor.

11. An inkjet printing composition comprising:
    a composition according to claim 1;
    a metal oxide; and
    a dye.

12. The inkjet printing composition of claim 11, wherein the metal oxide is a cationic metal oxide.

13. The inkjet printing composition of claim 11, wherein the metal oxide is an alumina oligomer.

14. The inkjet printing composition of claim 11, wherein the dye comprises one or more of a anthraquinone, catechol, hydroxyazo or salicylic acid groups.

15. The inkjet printing composition of claim 11, wherein the dye is one or more of Carminic Acid, Alizarin Red, Acid Blue 45, Acid Green 41, Hematoxylin, Chromoxane Cyanine R, Calconcarboxylic Acid, Plasmocorinth B, Pyrocatechol, Acid Alizarin Violet N, Mordant Yellow 12, or Mordant Blue 9.

16. The inkjet printing composition of claim 11, further comprising an inkjet additive.

17. The inkjet printing composition of claim 16, wherein the inkjet additive is one or more of a polyol, viscosity modifier, non-ionic surfactant, drying preventing agent, penetration accelerator, ultraviolet light absorber, antioxidant, antifungal agent, pH adjuster, anti-foaming agent, dispersion aid, dispersion stabilizer, anti-rusting agent, or chelating agent.

18. The composition of claim 1, wherein the natural polymer scaffold is nanocrystalline cellulose or cellulose fibers.

19. The composition of claim 1, wherein the natural polymer scaffold is lignin.

20. The composition of claim 1, wherein the natural polymer scaffold is chitin.

21. The composition of claim 1, wherein the natural polymer scaffold is chitosan or nanofibrillated chitosan.

22. The composition of claim 1, wherein the natural polymer scaffold is poly-glucosamine.

23. The composition of claim 1, wherein the natural polymer scaffold is wool.

24. The composition of claim 1, wherein the natural polymer scaffold is silk.

25. The composition of claim 1, wherein the natural polymer scaffold is cotton.

26. The composition of claim 1, wherein the natural polymer scaffold is positively functionalized.

* * * * *